US008542155B2

(12) United States Patent
Chua et al.

(10) Patent No.: US 8,542,155 B2
(45) Date of Patent: Sep. 24, 2013

(54) WIRELESS COMMUNICATIONS DEVICE AND HOUSING FOR A WIRELESS COMMUNICATIONS DEVICE

(75) Inventors: Shih Yang Chua, Singapore (SG); Sivalingam Sundaram, Singapore (SG)

(73) Assignee: Brady Worldwide, Inc., Milwaukee, WI (US)

( * ) Notice: Subject to any disclaimer, the term of this patent is extended or adjusted under 35 U.S.C. 154(b) by 242 days.

(21) Appl. No.: 13/194,295

(22) Filed: Jul. 29, 2011

(65) Prior Publication Data

US 2013/0027264 A1    Jan. 31, 2013

(51) Int. Cl.
*H01Q 1/24* (2006.01)

(52) U.S. Cl.
USPC .......................................... 343/702; 343/789

(58) Field of Classification Search
USPC .......................................... 343/702, 789, 872
See application file for complete search history.

(56) References Cited

U.S. PATENT DOCUMENTS

| 4,955,084 | A | 9/1990 | Umetsu et al. |
| 7,161,548 | B2 | 1/2007 | Tsukamoto |
| 7,804,453 | B2 | 9/2010 | Chiang et al. |
| 8,363,824 | B2 * | 1/2013 | Jorgensen ................ 379/433.08 |
| 2004/0227679 | A1 | 11/2004 | Lu |
| 2007/0109208 | A1 | 5/2007 | Turner |
| 2008/0063218 | A1 | 3/2008 | Weber et al. |
| 2009/0052154 | A1 | 2/2009 | Wilber et al. |
| 2009/0160712 | A1 | 6/2009 | Breiter et al. |

FOREIGN PATENT DOCUMENTS

| DE | 2007019033 U1 | 2/2010 |
| WO | 2010027565 A2 | 3/2010 |

OTHER PUBLICATIONS

PCT International Search Report and Written Opinion of PCT/US2012/047852, Nov. 12, 2012.

\* cited by examiner

*Primary Examiner* — Tan Ho
(74) *Attorney, Agent, or Firm* — Quarles & Brady LLP

(57) ABSTRACT

A housing for a wireless communications device includes a metal cover. An aperture is formed in the metal cover adjacent an antenna to limit interference with transmissions through the antenna, while providing structural strength to the housing. The opposing side of the housing is made from a material that allows transmission from the antenna with limited interference, thereby providing omni-directional transmissions.

20 Claims, 4 Drawing Sheets

WIRELESS COMMUNICATIONS DEVICE AND HOUSING FOR A WIRELESS COMMUNICATIONS DEVICE

BACKGROUND

There are a number of considerations in the design of a housing for a wireless communication device. Because wireless devices are typically carried by a user, it is desirable, for example, that the devices be lightweight. However, because wireless devices can also be easily dropped, it is also important that the case or housing be sufficiently strong to limit damage to internal components. In any wireless communication device or system, moreover, antenna performance is important to both functionality and user experience, and it is important that the housing be selected to limit interference with communications to the antenna.

To maximize antenna performance, typical wireless devices are therefore often constructed with plastic housings, which allow largely unimpeded transmissions from the antenna. Plastic housings also provide a lightweight casing, another desirable characteristic.

Metal housings, however, can also be useful for a number of reasons. Metal housings, for example, can be used to create thin wireless devices such as "wireless cards," and can also provide additional benefits including electromagnetic shielding, and increased strength. Metal housings for wireless devices can, therefore, be desirable, despite interference caused with antennas.

One method for allowing antenna transmissions while still using a metal cover is to provide an aperture in the metal adjacent the antenna. While an aperture is helpful in allowing transmissions, however, apertures allow dust and contaminants inside of the wireless device, and can therefore increase maintenance costs, and decrease the life span of the electronics. The present invention addresses these and other issues.

SUMMARY

In one aspect, the invention comprises a housing for a wireless communications device, including a plastic base member, a metal cover coupled to the base member, and an aperture provided in the metal cover, and located in the metal cover in a position selected to locate the aperture an antenna to be received in the housing. A label comprising a material selected to limit interference with transmissions of the antenna, is positioned over the aperture.

In another aspect of the invention, the label comprises plastic material, and can be a polycarbonate material. The label can have a thickness dimension of about 0.25 mm. The label can also comprise a material selected to meet the UL 94 VTM-2 fire standard.

In yet another aspect of the invention, the metal cover comprises a stainless steel material, and can have a thickness of about 0.19 mm. The aperture can be sized and dimensioned to have a length dimension about three times the width dimension. The width can be $\frac{1}{12}$ of the wavelength of the antenna, and the length $\frac{1}{4}$ of the wavelength of the antenna.

In another aspect of the invention, a wireless communications device is provided. The wireless communications device comprises a communications circuit, including an antenna for transmitting wireless communications to external devices, and a housing for receiving the communications circuit. The housing includes a metal cover, a plastic base member coupled to the metal cover, and an aperture located in the metal cover adjacent the antenna. A label is positioned over the aperture, and comprises a material selected to limit electromagnetic interference with the antenna.

In another aspect of the invention, the wireless communications device comprises a receptacle for connecting the wireless communications device to a universal serial bus. The wireless communications device can be powered from the universal serial bus on a host device.

The antenna on the microchip device can comprise a microchip antenna, and can be selected to operate in the ISM band. The wireless communications device can also include circuitry for communicating with at least one of a WLAN and a Bluetooth protocol.

These and other aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

DETAILED DESCRIPTION

Figure 1:
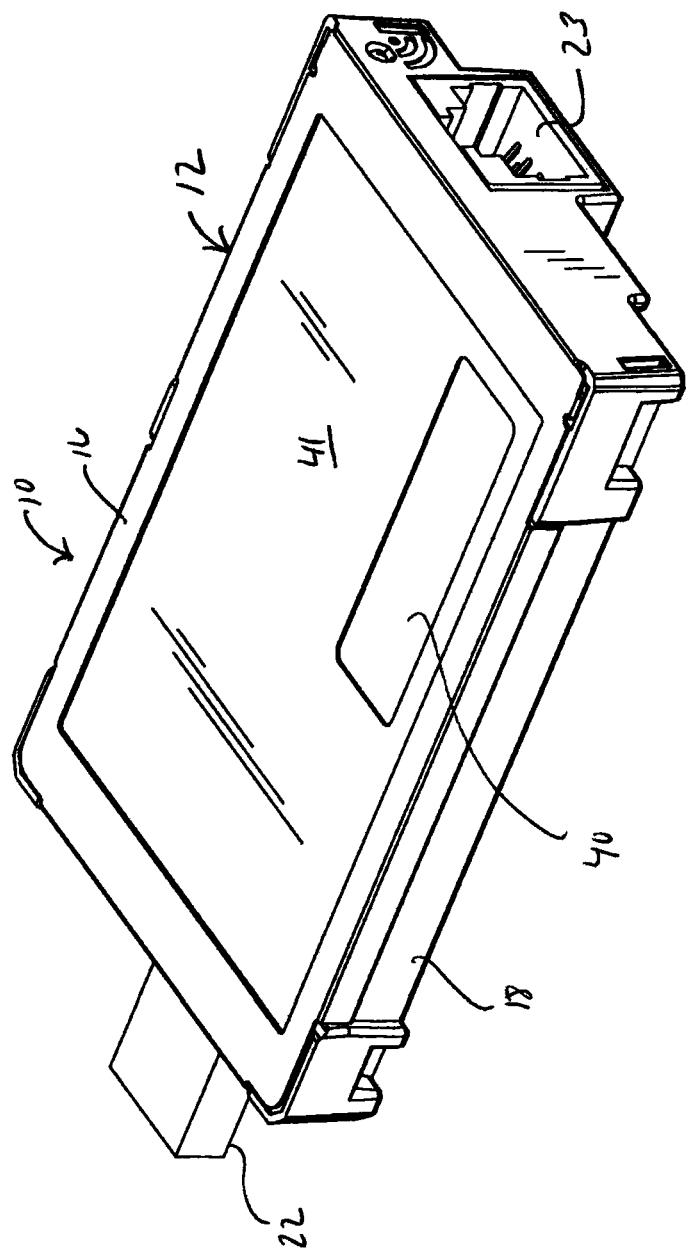
FIG. 1 is a perspective view of a wireless communication device constructed in accordance with the present invention with a top cover exposed.
Figure 2:
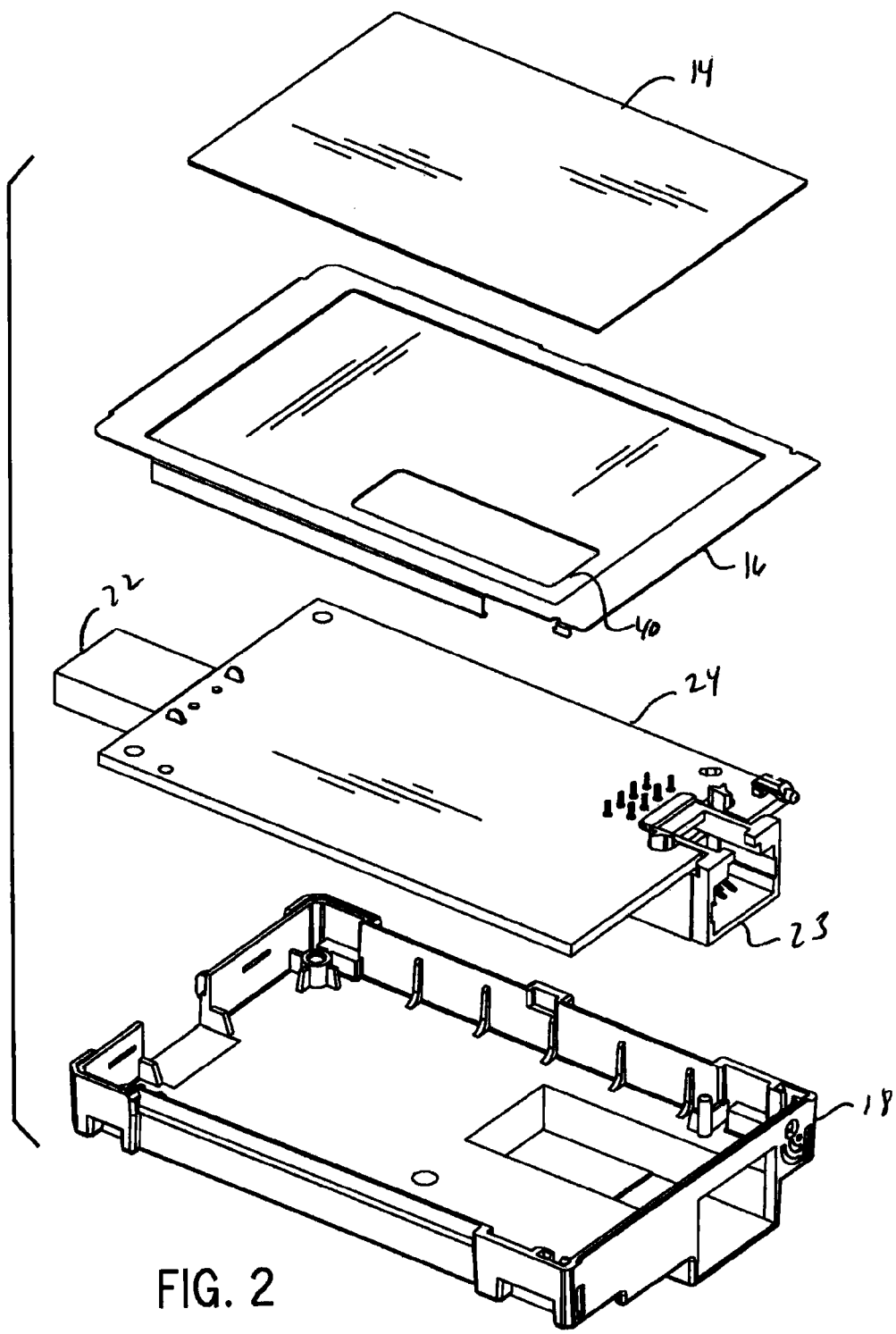
FIG. 2 is an exploded view of a wireless communications device constructed in accordance with the present invention.

Referring now to the figures and more particularly to FIGS. 1 and 2, a communications adapter device 10 includes a housing 12 comprising a top cover 16 and a lower base member 18. A communications board 24 is provided between the top 16 and bottom 18 sections of the housing 12, and a label 14 is positioned on the top cover 16. A receptacle 22 for connection to an external device can be provided at one end of the communications adapter device 10. Here, the receptacle 22 is shown as a Universal Serial Bus (USB) type A connector. Various other types of connectors can also be used. The cover 16 can comprise a metal material, which is preferably stainless steel, while the bottom 11 comprises a material that allows transmissions from the antenna with limited interference, such as plastic. An aperture 40 can be provided in the cover 16 to limit interference and improve transmission from the antenna, as described more fully below.

Figure 5:
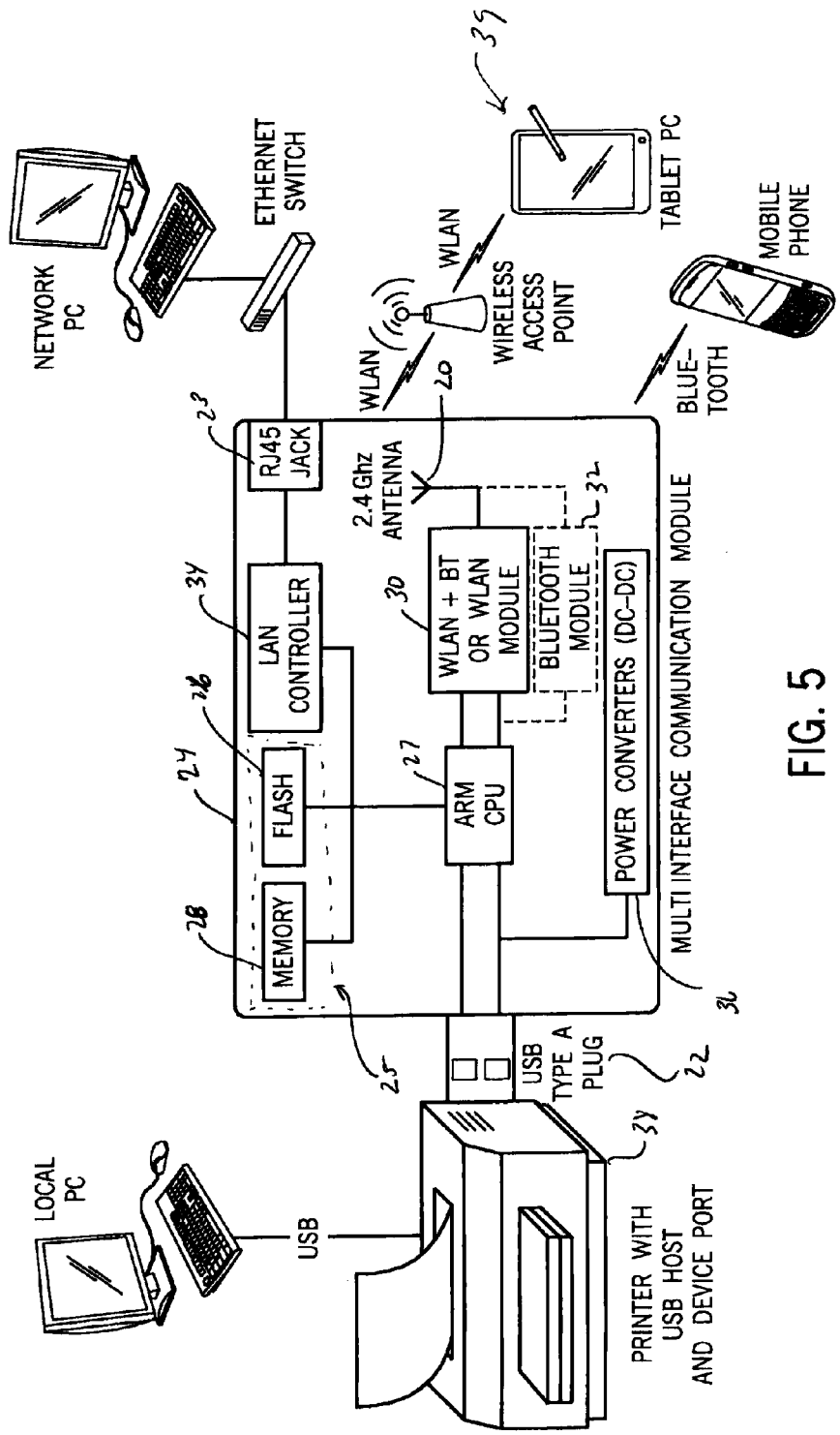
FIG. 5 is a block diagram of one embodiment of a circuit card that can be used in FIG. 2.

Referring now to FIG. 5, a block diagram of one embodiment of a communications board that can be used with the housing 12 is shown. Here, the receptacle 22 is connected to the communications board 24, and can be connected, for example, to a universal serial bus (USB) port on an external USB host device 38. The communications board 24 includes a processor 27, such as a microprocessor, microcontroller, or other device, that is programmed to process communications received between the external device 38 on the USB port, and one or more wired or wireless communication devices for communicating with peripheral devices.

The wireless communication devices on communication board 10 can include, as shown here, a WLAN communication device 30, Bluetooth device 32 or other wireless communications devices operating to provide other wireless protocols including Zigbee, 3G, 4G, IEEE 802.11, etc. The processor 27 can also communicate through a communication device to a network through a local area network or wide area network connector, such as Ethernet Communications device 34, which can be connected to an RJ 45 connector 23 as shown here. In addition to the processor 27, a memory component 25 comprising, for example, a flash 26 and a RAM memory 28, which can be, for example, a synchronous dynamic random-access memory (SDRAM). Although specific type of memory is shown here, various types of memory components suitable for this application will be apparent to those of ordinary skill in the art including Read Only Memory (ROM), Electronically Programmable Read Only Memory (EPROM), Erasable Electronically Programmable Read Only Memory (EEPROM), etc. Although a number of different processors could be used in this application, the microcontroller is preferably an ARM microcontroller with integrated peripheral controllers, including, for example, a Synchronous dynamic random access memory (SDRAM) controller, Flash controller, and static random-access memory (SRAM) controller. The processor also can include serial interfaces, including universal serial bus (USB), Secure Digital Input Output (SDIO), universal asynchronous receiver transmitter (UART), serial digital interface (SDI), and Inter-Integrated Circuit (I2C).

Referring still to FIG. 5, the USB connection to receptacle 22 provides power for operating the communications board 24 through the DC to DC convertor 36, and the processor 27 transmits information bi-directionally between external devices communicating through the communications devices 30, 32, 34 to the connected peripheral device 38. Communications to the communications card 24 from peripheral devices 39 can be, as shown here, from a networked PC, a tablet PC, or a mobile phone, for example, although any device capable of communication with the communication board 24 can be used. Although the wireless communication board 24 can be connected to various devices, in the embodiment shown here, the connected host device 38 is a printer. Computers, cellular phones, personal digital assistants, and other electronic devices, however, can be connected.

Referring still to FIG. 5, the main memory 28 can store instructions used to execute the operating system, as well as executable software for the communication module application. The memory 28 can also store temporary processes and variables, raw print job data extracted from the Bluetooth 32, WLAN 30 and LAN 34 interfaces during operation through, for example, a Dynamic RAM bus interface with the processor 27.

Referring still to FIG. 5, the Flash memory provides permanent storage for storing the board support package, a boot loader, an operating system kernel, firmware drivers and application software for the communication module. The processor 27 can, for example, boot up from the flash memory 26. The flash memory 26 can also include a backup boot image that can be retrieved to safely re-boot the system when there is a boot failure due to, for example, a boot loader corruption. The flash can be connected with the processor 27 on a Static RAM interface.

Referring yet again to FIG. 5, the LAN controller 34 can be a non Peripheral Component Interconnect (PCI) LAN controller that includes both integrated physical and Media Access Control (MAC) layers. It is connected with the MCU's Static RAM interface. When configured in this way, the LAN controller 34 can support 10/100 Mbps transfer rate and support multiple power modes.

Referring still to FIG. 5, the WLAN module 30 can be a highly integrated System In Package (SIP) unit, which comprises a wireless MAC base band controller (I.E.E.E. 802.1 lb/g/n Platform for Internet Content Selection (PICS) compliant), RF power amplifier, clock oscillators, DC-DC converters and RF transceivers. It can also support IEEE 802.11d, e, h, I, k, r, s PICS. It can also support the Bluetooth coexistence. It can be connected with a SDIO peripheral interface controller with the processor 27. The Bluetooth module 32 can also be a highly integrated standalone unit which consists of a Bluetooth base band controller, transceiver and clock oscillators. The Bluetooth module 32 can communicate with the processor 27 through a Universal Asynchronous Receiver Transmitter (UART) interface, and can support Bluetooth version 2.1+EDR standard. As shown here, optionally the Bluetooth module can be integrated with WLAN module 30 as a single package. In that case, the UART interface from the main MCU is shared between these two different Bluetooth modules.

Figure 3:
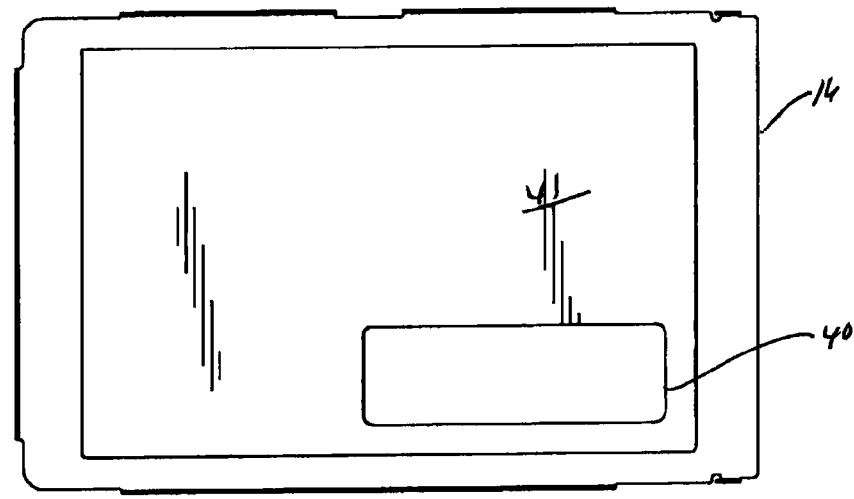
FIG. 3 is a top view of the cover of the wireless communications device of FIG. 2.
Figure 4:
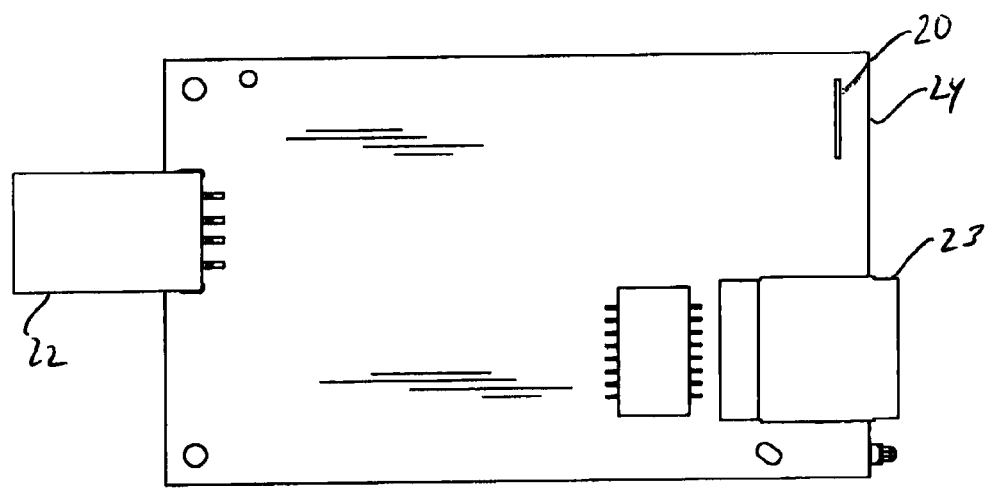
FIG. 4 is a top view of a printed circuit card that can be used in the construction of FIG. 2.

Referring again to FIGS. 1, 2, and 3, the top cover 16 of the wireless communications device 10 includes an aperture 40 that can be positioned adjacent the antenna 20, and can be oriented one to three length to width with respect to the antenna 20. To minimize interference from the cover 16, the length of the aperture 40 can be selected as a multiple of a wavelength. In one embodiment of the invention, for example, a 10 mm by 30 mm aperture which corresponds to a $\frac{1}{12}\lambda$ by $\frac{1}{4}\lambda$ aperture size was shown to be useful in limiting interference with the antenna 20. An aperture having a length dimension in a range between about $\frac{1}{4}\lambda$ and $\frac{1}{2}\lambda$ has been shown to provide the best performance characteristics.

The antenna 20 is preferable a microstrip or multilayer chip antenna, although other types of antennas are possible. In one embodiment of the invention a AT8010-E2R9HAA antenna was shown to be advantageous. This device is available from Advanced Ceramic X Corp., Tzuchieng Road, Shinchu Industrial District, Shinchu, Hsien 303, Taiwan. The antenna can be a 2.4 GHz antenna which operates in the Industrial Scientific Medical (ISM) band and can be used with WLAN, Bluetooth, and other types of communication devices including these described above.

Referring again to FIG. 1, the cover 16 comprises a metal material which is preferably stainless steel while the bottom 11 comprises a material that allows transmissions from the antenna with limited interference, such as plastic. The metal cover 16 and plastic bottom 18 include corresponding mating surfaces that allow the cover 16 and bottom 18 to be snapped together. The bottom 18 can also include holes or posts for mounting a wireless communication board 24 into the housing 12, and one or more indentations or apertures for receiving a connector for connecting to external drives, as discussed below. The metal cover 16 can be constructed of a stainless steel material, and stainless steel SUS303 has been used beneficially in the application. The stainless steel can have a thickness of about 0.19 mm, which has been shown to be helpful in reducing electromagnetic interference with transmissions from the antenna, although various other thicknesses could also be used. The cover 16 can be positioned above the antenna 20 a distance selected to provide sufficient clearance from the printed circuit board, while maintaining sufficient strength in the cover 16 to prevent, for example, collapse, or damage when dropped. In one application, a distance of between 5-6 mm above has been shown to be advantageous although, again, this distance can be varied. To further limit interference between the cover 16 and the wireless communication board 24, an insulator can be positioned between the cover 16 and the communication board 24.

Referring still to FIG. 1, in order to meet required safety standards for information technology equipment fire, dust, and spray tests, the label 14 provided over the aperture 40 and on cover 16 preferably comprises a plastic material such as a polycarbonate. The thickness of the label 14 can be selected to provide a sufficiently stiff surface over the aperture to make it difficult for a user to detect the label. The label 14 can be as thick as the sheet metal constructing cover 16, and in one embodiment, a label 14 having a thickness of 0.25 mm was used advantageously. The label is preferably constructed of a material that can be printed on to provide regulatory information, such as FCC (Federal Communications Commission), CE (European Conformity), RoHS (Restriction of Hazardous Substances directive), or power rating data. To meet fire safety standards, the material can be selected to pass a UL 94 VTM-2, or IEC 60950 standard for fire rating. To assure that the label 14 can be properly positioned over the aperture 40, the cover 16 can include an indentation 41 sized and dimensioned to receive the label 60. Although the label 14 is shown here to extend across a significant portion of the cover 16, the label 14 can be made in a reduced size and positioned to cover the aperture 40.

When the circuit board 24 is enclosed in the housing 12, the portion of the housing 12 nearest the antenna 20 is the bottom 18, which is constructed of plastic. The opposing side, the top cover 16, is metal, as described above, but the aperture 40 improves the ability of the communications device 10 to transmit data, providing omni-directional gain and allowing the wireless communications device 10 to be used in multiple orientations. Without a metal cover, the antenna 20 has been shown to have a gain of about 34.5%. If the metal cover is solid metal, the gain is about 17.8%. Using a cover 16 with an aperture 40 as described herein, a gain of about 27.5% has been shown while operating with the label 14 in position enclosing the aperture 40. The system described herein, therefore, allows for an improved transmission of communications from the communications board 24 while allowing the wireless communication device 10 to have improved strength characteristics as compared to an overall plastic construction, and while still meeting the fire standard ratings safety standards for IT equipment. The housing 12 with label 14 also meets dust and spray testing standards, and helps to minimize or prevent effects of electromagnetic interference that could result from touching the internal components on the printed circuit board 24.

In one example of the use of the communication device 10, the communication device 10 is connected to a USB host 38 through the USB port on the printer. External or peripheral devices 39 can communicate data, including print jobs, through wireless communication devices 30 and 32, or through the wired connection 34. Communications transmitted from wireless peripheral devices are received by the antenna 20, and are transmitted to the host device 38 for printing. Although a printer is one application, the principles described here can also be applied to various other computer environments.

It should be understood that the methods and apparatuses described above are only exemplary and do not limit the scope of the invention, and that various modifications could be made by those skilled in the art that would fall under the scope of the invention. For example, the wireless communications board discussed above, as well as the corresponding connectors and communication devices, are exemplary. Various types of communication devices, connectors, protocols, and memory devices can be used. Also, while the cover and base member are described above as a top and bottom, the configuration can be reversed. Although the aperture is shown and described as rectangular, various shapes can be used. Various other modifications will be apparent to those of skill in the art. To apprise the public of the scope of this invention, the following claims are made:

We claim:

1. A housing for a wireless communications device, the housing comprising:
    a plastic base member;
    a metal cover coupled to the base member;
    an aperture provided in the metal cover, and located in the metal cover in a position selected to locate the aperture an antenna to be received in the housing; and
    a label positioned over the aperture, the label comprising a material selected to limit interference with transmissions of the antenna.

2. The housing of claim 1, wherein the label comprises plastic.

3. The housing of claim 1, wherein the aperture is about $\frac{1}{12}$ of the wavelength of the antenna in width and $\frac{1}{4}$ of the wavelength of the antenna in length.

4. The housing of claim 1, wherein the label comprises a polycarbonate material.

5. The housing of claim 1, wherein the metal cover has a thickness of about 0.19 mm.

6. The housing of claim 1, wherein the metal cover is constructed from stainless steel.

7. The housing of claim 1, wherein the label comprises a material selected to meet the UL 94 VTM-2 fire standard.

8. The housing of claim 1, wherein the label has a thickness dimension of about 0.25 mm.

9. The housing of claim 1, wherein the aperture is sized and dimensioned to have a length dimension about three times the width dimension.

10. A wireless communications device, comprising:
    a communications circuit including an antenna for transmitting wireless communications to external devices;
    a housing for receiving the communications circuit, the housing including:
        a metal cover;
        a plastic base member coupled to the metal cover;
        an aperture located in the metal cover adjacent the antenna; and
    a label positioned over the aperture, the label comprising a material selected to limit electromagnetic interference with the antenna.

11. The wireless communications device of claim 10, further comprising a receptacle for connecting the wireless communications device to a universal serial bus.

12. The wireless communications device of claim 10, wherein the communication circuit is powered from the universal serial bus on a host device.

13. The wireless communications device of claim 10, wherein the antenna comprises a microchip antenna.

14. The wireless communications device of claim 10, wherein the antenna is selected to operate in the ISM band.

15. The wireless communications device of claim 10, wherein the communications circuit includes circuitry for communicating with at least one of a WLAN and a Bluetooth protocol.

16. The wireless communications device of claim 10, wherein the metal cover comprises a steel material.

17. The wireless communications device of claim 10, wherein the metal cover comprises a material having a thickness of about 0.19 mm.

18. The wireless communications device of claim 10, wherein the label comprises a polycarbonate material.

19. The wireless communications device of claim 10, wherein the label has a thickness of substantially 0.25 mm.

20. The wireless communications device of claim 10, wherein the aperture is substantially rectangular in shape, and the length is dimensioned to be substantially three times the width.

* * * * *